(12) United States Patent
Kim et al.

(10) Patent No.: US 7,714,321 B2
(45) Date of Patent: May 11, 2010

(54) ORGANIC THIN FILM TRANSISTOR, FLAT DISPLAY DEVICE INCLUDING THE SAME, AND METHOD OF MANUFACTURING THE ORGANIC THIN FILM TRANSISTOR

(75) Inventors: Sung-Jin Kim, Suwon-si (KR); Jae-Bon Koo, Suwon-si (KR); Min-Chul Suh, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 30 days.

(21) Appl. No.: 11/378,011

(22) Filed: Mar. 17, 2006

(65) Prior Publication Data

US 2006/0208253 A1    Sep. 21, 2006

(30) Foreign Application Priority Data

Mar. 19, 2005  (KR) ................ 10-2005-0022945
Mar. 22, 2005  (KR) ................ 10-2005-0023841

(51) Int. Cl.
*H01L 35/24* (2006.01)
*H01L 51/00* (2006.01)

(52) U.S. Cl. ............... 257/40; 257/59; 257/72; 257/E51.001

(58) Field of Classification Search .......... 257/40, 257/59, 72
See application file for complete search history.

(56) References Cited

U.S. PATENT DOCUMENTS 5,596,208 A * 1/1997 Dodabalapur et al. ......... 257/66
6,413,790 B1   7/2002 Duthaler et al.

(Continued)

FOREIGN PATENT DOCUMENTS

EP   1 033 765 A2   9/2000

(Continued)

OTHER PUBLICATIONS

European Search Report by European Patent Office on Jun. 7, 2006.

(Continued)

*Primary Examiner*—Eugene Lee
*Assistant Examiner*—Anthony Ho
(74) *Attorney, Agent, or Firm*—Knobbe Martens Olson & Bear LLP

(57) ABSTRACT

An organic thin film transistor, a flat display device including the same, and a method of manufacturing the organic thin film transistor are disclosed. In one embodiment, the organic thin film transistor includes: i) a substrate, ii) a gate electrode disposed on the substrate, iii) a gate insulation film disposed on the gate electrode, iv) a source electrode and a drain electrode spaced from each other and disposed on the gate insulation film, v) an organic semiconductor layer contacting the source electrode and the drain electrode and having an edge to be distinguished from an adjacent organic thin film transistor, and vi) a cantilever layer disposed to cover the organic semiconductor layer, contacting a portion of a layer which is disposed in or under the organic semiconductor layer, and is exposed to the outside of the edge of the organic semiconductor layer. According to one embodiment, a patterning effect of an organic semiconductor layer is easily obtained and characteristics such as an on/off ratio are improved.

21 Claims, 14 Drawing Sheets

U.S. PATENT DOCUMENTS

| | | |
|---|---|---|
| 6,603,139 B1 | 8/2003 | Tessler et al. |
| 6,916,681 B2 * | 7/2005 | Asano et al. .................. 438/99 |
| 2003/0160235 A1 * | 8/2003 | Hirai ........................... 257/40 |
| 2004/0012018 A1 * | 1/2004 | Tanabe ........................ 257/40 |
| 2004/0023447 A1 | 2/2004 | Hirakata et al. |
| 2004/0124410 A1 * | 7/2004 | Lee et al. ..................... 257/40 |
| 2004/0129937 A1 * | 7/2004 | Hirai ........................... 257/40 |
| 2004/0129978 A1 * | 7/2004 | Hirai ......................... 257/347 |
| 2004/0209117 A1 * | 10/2004 | Aziz et al. .................. 428/690 |
| 2004/0232411 A1 * | 11/2004 | Nakamura ................... 257/40 |
| 2005/0009327 A1 * | 1/2005 | Yoshida et al. .............. 438/661 |
| 2005/0029514 A1 * | 2/2005 | Moriya ........................ 257/40 |
| 2005/0139823 A1 * | 6/2005 | Hirakata et al. .............. 257/40 |
| 2005/0211975 A1 * | 9/2005 | Kawasaki et al. ............ 257/40 |
| 2006/0113523 A1 * | 6/2006 | Kubota et al. ................ 257/40 |
| 2006/0121643 A1 * | 6/2006 | Seo et al. ..................... 438/99 |
| 2006/0208266 A1 * | 9/2006 | Yamamoto ................... 257/88 |

FOREIGN PATENT DOCUMENTS

| | | |
|---|---|---|
| EP | 1 422 766 A2 | 5/2004 |
| JP | 2004-080026 | 3/2004 |
| KR | 10 2004 0056246 A | 6/2004 |
| WO | WO 03/030278 A2 | 4/2003 |

OTHER PUBLICATIONS

Gilles Horowitz, "Organic Field-Effect Transistors", Advanced Materials, 1998, 10, No. 5, pp. 365-377.

Christos D. Dimitrakopoulos and Patrick R. L. Malenfant, "Organic Thin Film Transistor for Large Area Electronics", Advanced Materials 2002, 14, No. 2, Jan. 16, pp. 99-117.

R.T. Howe and R.S. Muller, "Polycrystalline Silicon Micromechanical Beams", Solid-State Science and Technology, vol. 130, No. 6, Jun. 1983, pp. 1420-1423.

Office Action for Japanese Patent Application No. 2006-056768 dated Dec. 22, 2009 by Japanese Patent Office.

* cited by examiner

ORGANIC THIN FILM TRANSISTOR, FLAT DISPLAY DEVICE INCLUDING THE SAME, AND METHOD OF MANUFACTURING THE ORGANIC THIN FILM TRANSISTOR

CROSS-REFERENCE TO RELATED PATENT APPLICATION

This application claims the benefit of Korean Patent Application Nos. 10-2005-0022945 and 10-2005-0023841, filed on Mar. 19 and 22, 2005, respectively, in the Korean Intellectual Property Office, the disclosure of which are incorporated herein in their entirety by reference.

BACKGROUND OF THE INVENTION

1. Field of the Invention

The present invention relates to an organic thin film transistor, a flat display device including the same, and a method of manufacturing the organic thin film transistor. More particularly, the invention relates to an organic thin film transistor that easily obtains a patterning effect of an organic semiconductor layer and improves characteristics such as an on/off ratio, a flat display device including the organic thin film transistor, and a method of manufacturing the organic thin film transistor.

2. Description of the Related Technology

Flat display devices such as liquid crystal display devices (LCDs) or electroluminescence display devices (ELDs) use a thin film transistor to serve as a switching device for controlling an operation of a pixel and a pixel-driving device.

The thin film transistor includes a source electrode and a drain electrode facing each other, a semiconductor layer including a channel region formed between the source electrode and the drain electrode, and a gate electrode insulated from the source electrode, the drain electrode, and the semiconductor layer.

When the thin film transistor having the above-described structure is formed in an array, since it acts as an independent switching device, the semiconductor layer may be preferably patterned in order to prevent cross talk between adjacent thin film transistors. In conventional silicon thin film transistors, photolithography is used to pattern silicon semiconductor layers.

Meanwhile, as research for flexible flat display devices continues, attempts to use a plastic substrate instead of a glass substrate have been made. However, since the plastic substrate cannot undergo high temperature processing, conventional silicon thin film transistors need to be replaced.

Therefore, methods of forming a thin film transistor on a plastic substrate at a low temperature have been suggested. In particular, research has been conducted into the manufacturing of an organic thin film transistor at a low temperature, i.e., a thin film transistor in which an organic semiconductor layer is formed. However, the organic semiconductor layer cannot be patterned using conventional photolithography. This is because a conventional method combined with a wet or dry type etching process can damage the organic semiconductor layer.

Also, the organic thin film transistor has disadvantages in that since an organic semiconductor material has a very high resistance, its mobility and on/off ratio are low, and if a gate electrode does not provide a sufficient channel to the organic semiconductor material, a current does not flow between a source electrode and a drain electrode.

SUMMARY OF CERTAIN INVENTIVE ASPECTS

One aspect of the present invention provides an organic thin film transistor in which a patterning effect of an organic semiconductor layer is easily obtained and characteristics such as an on/off ratio are improved, a flat display device including the organic thin film transistor, and a method of manufacturing the organic thin film transistor.

Another aspect of the present invention provides a first organic thin film transistor comprising: i) a substrate, ii) a gate electrode disposed on the substrate, iii) a gate insulation film disposed on the gate electrode, iv) a source electrode and a drain electrode spaced from each other and disposed on the gate insulation film, v) an organic semiconductor layer contacting the source electrode and the drain electrode and having an edge to be distinguished from an adjacent organic thin film transistor, and vi) a cantilever layer disposed to cover the organic semiconductor layer, contacting a part of a layer disposed in or under the organic semiconductor layer, and exposed to the outside of the edge of the organic semiconductor layer.

In one embodiment, a part of at least one of the gate insulation film, the source electrode, and the drain electrode may be exposed to the outside of the edge of the organic semiconductor layer.

In one embodiment, the cantilever layer may comprise at least a first opening to expose a portion of the organic semiconductor layer.

In one embodiment, the first opening of the cantilever layer may be disposed to correspond to a region other than the region between the source electrode and the drain electrode.

In one embodiment, a closed trace may be formed by a portion (contacting portion) that i) contacts the cantilever layer, ii) is disposed in or under the organic semiconductor layer, and iii) is exposed to the outside of the edge of the organic semiconductor layer.

In one embodiment, the region between the source electrode and the drain electrode may be located in the closed trace formed by the contacting portion.

In another embodiment, a straight line may be approximately formed by the contacting portion.

In one embodiment, at least a pair of parallel lines may be formed by the contacting portion.

In another embodiment, the region between the source electrode and the drain electrode may be located in the parallel line formed by the contacting portion.

In one embodiment, the gate insulation film may cover the gate electrode.

In one embodiment, the cantilever layer may be conductive.

In one embodiment, a bias voltage may be applied to the cantilever layer.

In one embodiment, a voltage having a polarity opposite to that of the voltage applied to the gate electrode may be applied to the cantilever layer.

In another embodiment, a voltage having a polarity opposite to that of the voltage applied to the gate electrode may be applied to the cantilever layer when a channel is formed in the organic semiconductor layer.

In one embodiment, the organic semiconductor layer may be a p-type organic semiconductor layer, and an electric potential of the cantilever layer may be lower than that of the gate electrode when the channel is not formed in the organic semiconductor layer.

In another embodiment, the organic semiconductor layer may be an n-type organic semiconductor layer, and an electric potential of the cantilever layer may be higher than that of the gate electrode when the channel is not formed in the organic semiconductor layer.

Another aspect of the present invention provides a second organic thin film transistor comprising: i) a substrate, ii) a gate electrode disposed on the substrate, iii) a gate insulation film disposed on the gate electrode, iv) a source electrode and a drain electrode spaced from each other and disposed on the gate insulation film, v) an organic semiconductor layer contacting the source electrode and the drain electrode and having an edge to be distinguished from an adjacent organic thin film transistor, vi) a cantilever layer disposed to cover the organic semiconductor layer, contacting a part of a layer disposed in or under the organic semiconductor layer, and exposed to the outside of the edge of the organic semiconductor layer, and vii) an auxiliary electrode contacting the cantilever layer and corresponding to the gate electrode.

In one embodiment, the auxiliary electrode may be disposed on the upper surface of the cantilever layer.

In another embodiment, the auxiliary electrode may be disposed on the bottom surface of the cantilever layer.

In one embodiment, a groove may be formed in the upper surface of the cantilever layer and the auxiliary electrode is disposed in the groove.

In another embodiment, a groove may be formed in the bottom surface of the cantilever layer and the auxiliary electrode is disposed in the groove.

In one embodiment, a second opening is formed in the cantilever layer and the auxiliary electrode is disposed in the second opening.

In one embodiment, a bias voltage may be applied to the auxiliary electrode.

In one embodiment, a voltage having a polarity opposite to that of the voltage applied to the gate electrode may be applied to the auxiliary electrode.

In another embodiment, a voltage having a polarity opposite to that of the voltage applied to the gate electrode may be applied to the auxiliary electrode when a channel is formed in the organic semiconductor layer.

In one embodiment, the organic semiconductor layer may be a p-type organic semiconductor layer, and an electric potential of the auxiliary electrode may be lower than that of the gate electrode when the channel is not formed in the organic semiconductor layer.

In another embodiment, the organic semiconductor layer may be an n-type organic semiconductor layer, and an electric potential of the auxiliary electrode may be higher than that of the gate electrode when the channel is not formed in the organic semiconductor layer.

In one embodiment, the cantilever layer may contact a part exposed to the outside of an edge of the organic semiconductor layer of one of the gate insulation film, the source electrode, and the drain electrode.

In one embodiment, the cantilever layer may comprise at least a first opening to expose a part of the organic semiconductor layer.

In one embodiment, the first opening of the cantilever layer may be disposed to correspond to a region other than a region between the source electrode and the drain electrode.

In one embodiment, a closed trace may be formed by the contacting portion.

In one embodiment, the region between the source electrode and the drain electrode may be located in the closed trace formed by the contacting portion.

In one embodiment, the gate insulation film may cover the gate electrode.

Another aspect of the invention provides a flat display device comprising the first organic thin film transistor.

Still another aspect of the invention provides a flat display device comprising the second organic thin film transistor.

Yet another aspect of the present invention provides a method of manufacturing an organic thin film transistor, the method comprising: i) forming a gate electrode on a substrate, a gate insulation film to cover the gate electrode, and a source electrode and a drain electrode spaced from each other and disposed on the gate insulation film, ii) forming a sacrificial layer to cover the source electrode, the drain electrode, and the gate insulation film, iii) patterning the sacrificial layer to expose at least a part of a layer under the sacrificial layer other than the region between the source electrode and the drain electrode, iv) forming a cantilever layer to cover the sacrificial layer and the exposed part of the layer under the sacrificial layer, v) removing the sacrificial layer and vi) forming an organic semiconductor layer in a region where the sacrificial layer is removed.

In one embodiment, the sacrificial layer may be a photoresist.

In one embodiment, the sacrificial layer may be removed using a wet type etching method.

In one embodiment, the organic semiconductor layer may be formed using one of a spin coating method and a dipping method.

In one embodiment, the method may further comprise: after forming the organic semiconductor layer, removing a remaining organic semiconductor material from the cantilever layer.

In one embodiment, the remaining organic semiconductor material may be removed by projecting ultraviolet radiation onto the remaining organic semiconductor material or ozone- or plasma-processing the remaining organic semiconductor material.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Embodiments of the present invention will now be described more fully with reference to the accompanying drawings.

Figure 1:
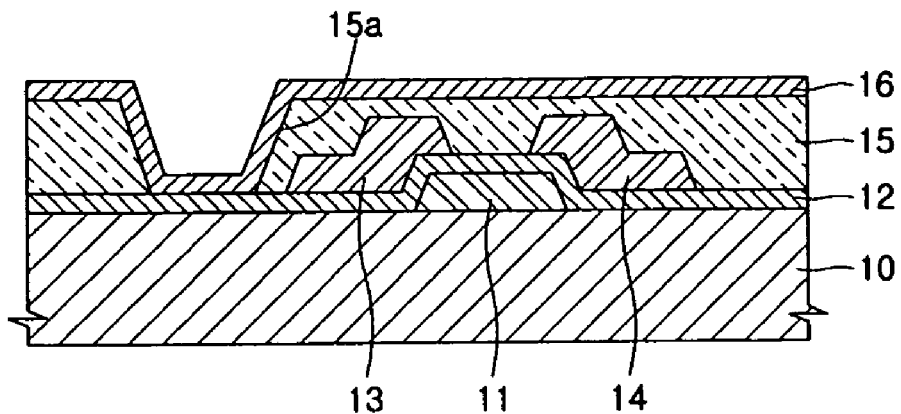
FIG. 1 is a schematic cross-sectional view of an organic thin film transistor according to an exemplary embodiment of the present invention.

FIG. 1 is a schematic cross-sectional view of an organic thin film transistor according to an exemplary embodiment of the present invention. Referring to FIG. 1, an organic thin film transistor is formed on a substrate 10. The substrate 10 may be formed of a glass material, a plastic material, or a metal. An insulating film (not shown) can be further interposed between the organic thin film transistor and a metal substrate.

The organic thin film transistor includes a gate electrode 11 formed on the substrate 10 and a gate insulation film 12 formed on the gate electrode 11. In one embodiment, as shown in FIG. 1, the gate insulation film 12 is formed in the entire surface of the substrate 10 to cover the gate electrode 11. In another embodiment, various changes in the gate insulation film 12 may be made, for example, it can be patterned on the substrate 10 or formed only on the gate electrode 11. In one embodiment, a buffer layer (not shown) may be further formed on the substrate 10 in order to maintain the smooth substrate 10 and prevent impurities from penetrating into the organic thin film transistor. The above-described structure of the organic thin film transistor can be equally applied to other embodiments to be described later.

A source electrode 13 and a drain electrode 14 which are spaced from each other are formed on the gate insulation film 12. An organic semiconductor layer 15 covering or contacting the source electrode 13 and the drain electrode 14 is formed on the gate insulation film 12. In one embodiment, the gate electrode 11, the source electrode 13, and the drain electrode 14 may be formed of conductive materials.

In one embodiment, the organic semiconductor layer 15 may be formed of a semiconductor organic material. In one embodiment, a high molecular weight organic semiconductor layer can be formed of one of the following: polythiophene, polyparaphenylenevinylene, polyparaphenylene, polyfluorene, polythiophenevinylene, polythiophene-heteocyclic aromatic copolymer, and derivatives of these materials. In one embodiment, a low polymer organic semiconductor layer can be formed of one of the following: a material selected from the group consisting of pentacene, tetracene, oligoacene of naphthalene, α-6-thiophene, oligothiophene of α-5-thiophene, metal-containing or metal-free phthalocyanine, pyromelitic dianhydride or pyromelitic diimide, and perylentetracarbossyl dianhydride or perylentetracarbossyl diimide, and derivatives of these materials. In another embodiment, the organic semiconductor layer can be formed of various materials other than the above-mentioned materials.

An edge 15a is formed in the organic semiconductor layer 15 to separate the organic thin film transistor from adjacent organic thin film transistors. Without the edge 15a, cross talk may be produced by a leakage current between adjacent organic thin film transistors via the continuously formed organic semiconductor layer 15.

However, since the organic semiconductor layer 15 has a high resistance, organic thin film transistors sufficiently spaced from each other do not produce cross talk even though the organic semiconductor layer 15 is formed into a single body. Therefore, in one embodiment, it is sufficient that the adjacent organic semiconductor layer 15 is patterned, i.e., includes the edge 15a, so that adjacent organic thin film transistors do not produce cross talk. In one embodiment, organic semiconductor layers may be separately patterned to correspond to respective organic thin film transistors in the following embodiments described below.

In one embodiment, the organic thin film transistor includes a cantilever (covering or protective) layer 16. The cantilever layer 16 is disposed to cover the organic semiconductor layer 15. In one embodiment, the cantilever layer 16 contacts a layer formed in the same plane with the organic semiconductor layer 15 or a layer under the organic semiconductor layer 15. For example, the cantilever layer 16 contacts a portion which is disposed in the same plane with the organic semiconductor layer 15 or under the organic semiconductor layer 15, and exposed to the outside of the edge 15a of the organic semiconductor layer 15. As illustrated in FIG. 1, the gate insulation film 12 disposed under the organic semiconductor layer 15 and the cantilever layer 16 contacts the part of the gate insulation film 12 exposed to the outside of the edge 15a of the organic semiconductor layer 15. Although the cantilever layer 16 is disposed to correspond to the entire region of the substrate 10 in FIG. 1, it is not limited thereto but may be changed into various forms including the patterning of the cantilever layer 16. The above-described structure of the cantilever layer 16 can be equally applied to other embodiments to be described later.

A manufacturing process of the organic thin film transistor according to an exemplary embodiment of the present invention as illustrated in FIG. 1 will now be described with reference to FIGS. 2 through 9.

Figure 2:
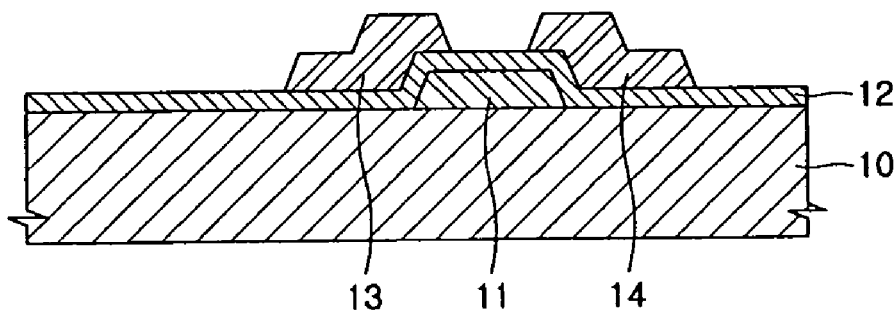
FIGS. 2 through 9 are schematic cross-sectional views of a manufacturing process of the organic thin film transistor illustrated in FIG. 1.

Referring to FIG. 2, the gate electrode 11 is formed on the substrate 10 and the gate insulation film 12 is formed to cover the gate electrode 11 and the remaining portion of the substrate 10. The source electrode 13 and the drain electrode 14 which are spaced from each other are formed on the gate insulation film 12.

Figure 3:
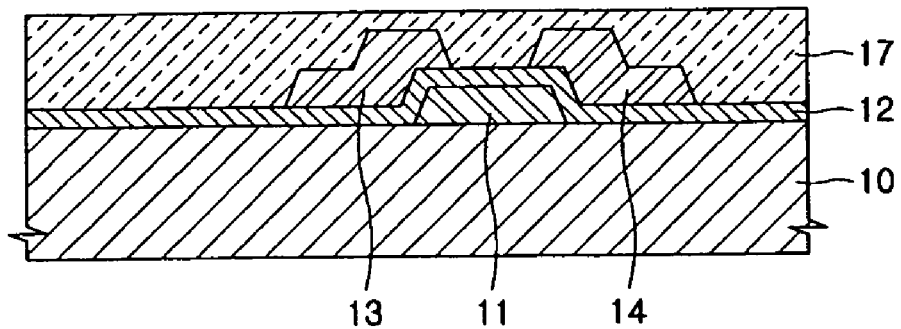
Figure 4:
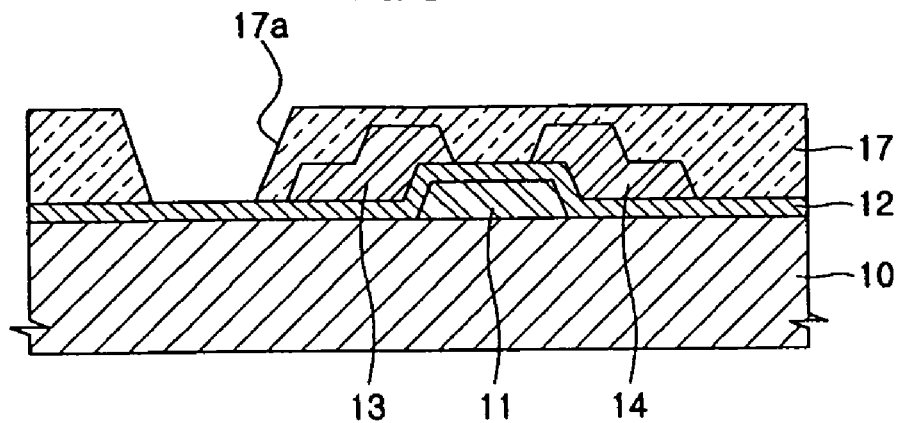

Referring to FIG. 3, a sacrificial layer 17 is formed to cover the source electrode 13, the drain electrode 14, and the gate insulation film 12. Referring to FIG. 4, the sacrificial layer 17 is patterned to form an edge 17a. In one embodiment, the patterning of the sacrificial layer 17 results in at least a part of a layer formed under the sacrificial layer 17 and other than the region between the source electrode 13 and the drain electrode 14 being exposed. A part of the gate insulation film 12 is exposed in the FIG. 4 embodiment. In another embodiment, a portion of the source electrode 13 and/or a portion of the drain electrode 14 can be exposed. The edge 17a is disposed at the same location as the edge 15a of the organic semiconductor layer illustrated in FIG. 1.

In one embodiment, the sacrificial layer 17 can be formed of a photoresist. The photoresist is coated, exposed to light and developed, thereby performing the patterning as illustrated in FIG. 4.

Figure 5:
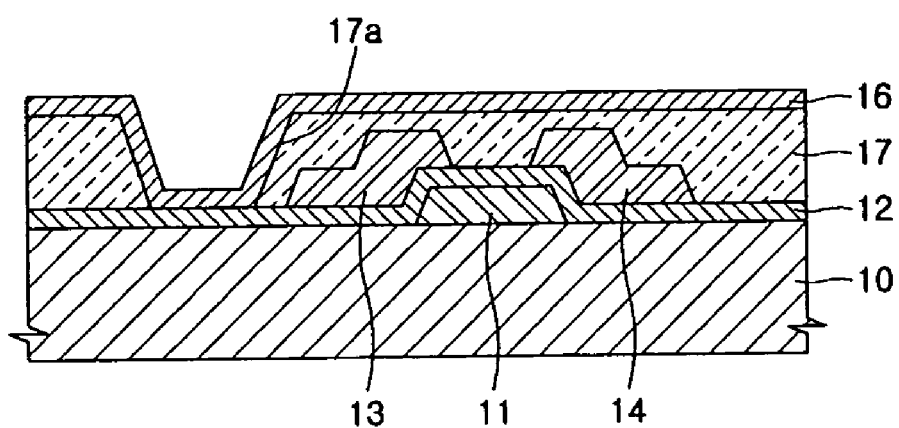

In one embodiment, after patterning the sacrificial layer 17, referring to FIG. 5, a cantilever layer 16 is formed to cover the sacrificial layer 17 and an exposed portion of i) the source electrode 13, ii) the drain electrode 14, or iii) the gate insulation film 12 which is disposed under the sacrificial layer 17. In the FIG. 5 embodiment, the cantilever layer 16 is formed on the exposed part of the gate insulation film 12 which is disposed under the sacrificial layer 17. In one embodiment, the cantilever layer 16 can be formed of tetra ethyl ortho silicate (TEOS) or silicon nitride, etc. In another embodiment, the cantilever layer 16 can be formed of various materials other than the above materials, and will generally have a sufficient mechanical integrity.

Figure 6:
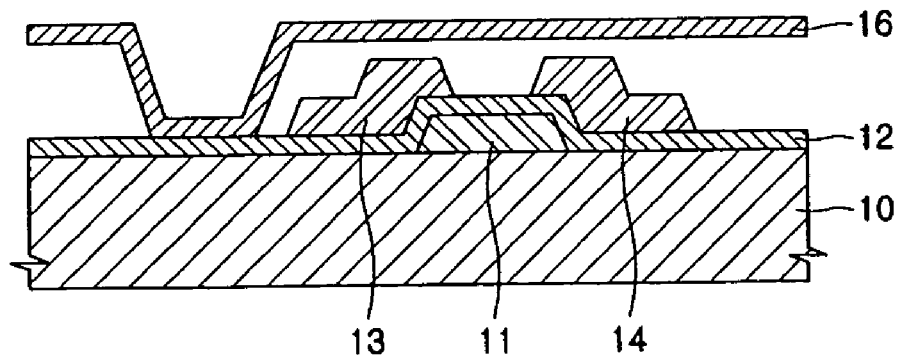

After the above processes, as shown in FIG. 6, the sacrificial layer 17 is removed, which produces a space between i) the source electrode 13, the drain electrode 14, or the gate insulation film 12 and ii) the cantilever layer 16. In one embodiment, the cantilever layer 16 has sufficient mechanical integrity to overcome stress caused by the underlying space.

A variety of methods may be used to remove the sacrificial layer 17, e.g., a wet type etching using an etching liquid such as HF, BHF, or ClF3. In one embodiment, the cantilever layer 16 may be formed of a material that is not modified or etched by the etching.

Figure 7:
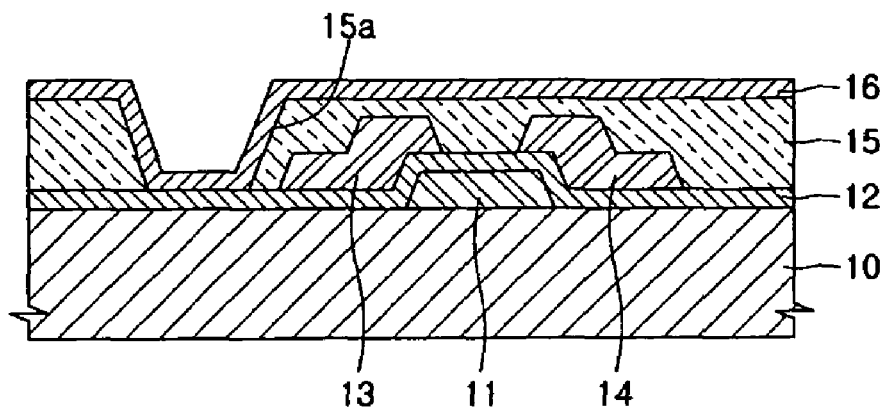

After the removal of the sacrificial layer 17, referring to FIG. 7, the organic semiconductor layer 15 is formed in the space from which the sacrificial layer 17 has been removed, thus completing the organic thin film transistor. A variety of methods may be used to form the organic semiconductor layer 15, e.g., a spin coating method or a dipping method.

Figure 8:
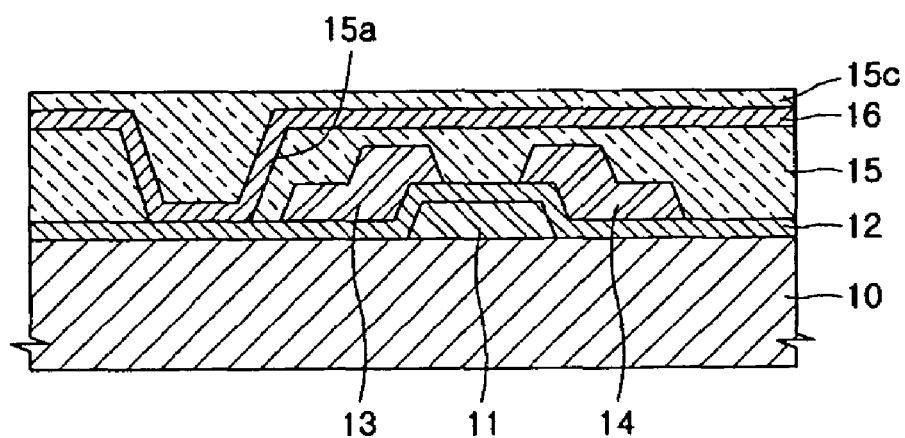

In one embodiment, when the spin coating method or the dipping method is used to form the organic semiconductor layer 15 in the etched space, an organic semiconductor material 15c can also be deposited on the cantilever layer 16 as illustrated in FIG. 8. In this embodiment, the organic semiconductor material 15c remaining on the cantilever layer 16 may be removed after forming the organic semiconductor layer 15.

Figure 9:
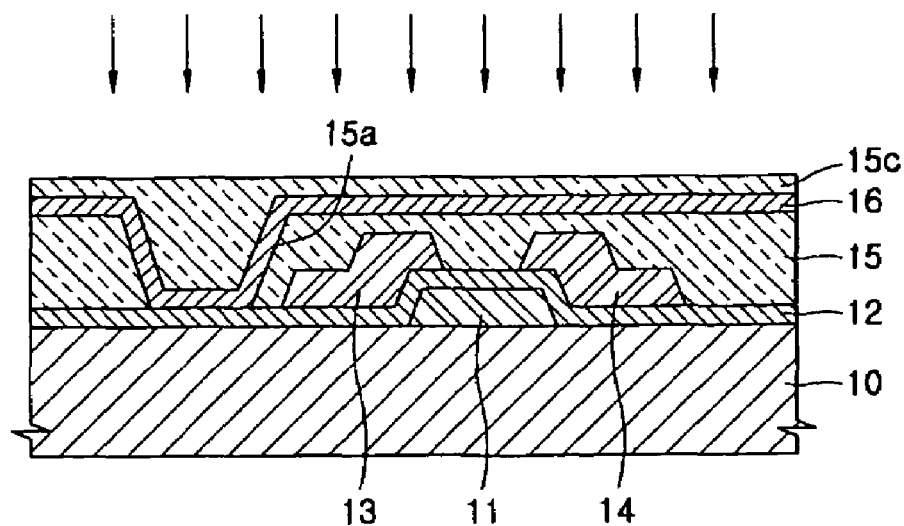

In one embodiment, as shown in FIG. 9, the organic semiconductor material 15c remaining on the cantilever layer 16 is removed by, for example projecting ultraviolet radiation or ozone O3- or plasma-processing the remaining organic semiconductor material 15c.

The organic thin film transistor as illustrated in FIG. 1 is manufactured using the above described process, thereby producing a patterning effect of the organic semiconductor layer 15 without physically patterning the layer 15. Furthermore, the cantilever layer 16 serves as a passivation layer that protects the organic thin film transistor from exterior moisture or other impurities, so that it is not necessary to form an additional passivation layer at a later step.

Figure 10:
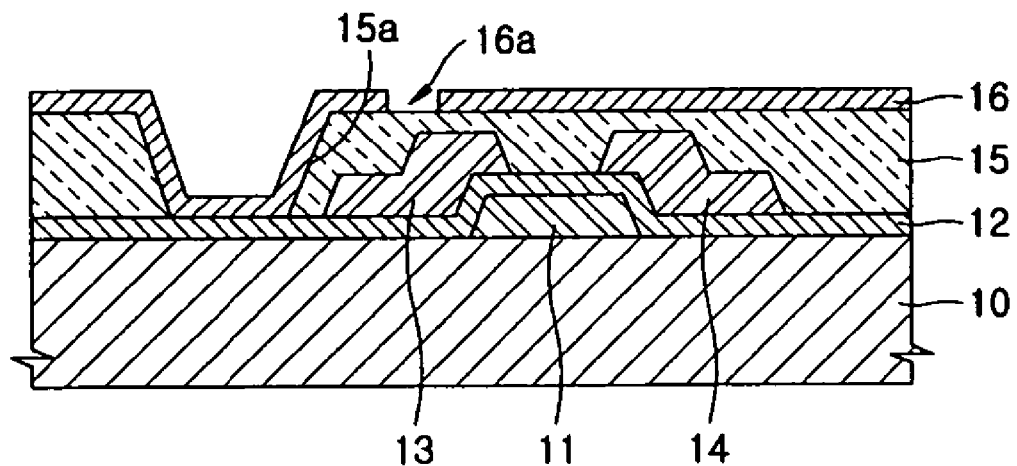
FIG. 10 is a schematic cross-sectional view of an organic thin film transistor according to another exemplary embodiment of the present invention.

FIG. 10 is a schematic cross-sectional view of an organic thin film transistor according to another exemplary embodiment of the present invention.

As described in the previous exemplary embodiment, an organic semiconductor material is provided in the etched space to form the organic semiconductor layer 15. The organic semiconductor layer 15 contacts or covers the source electrode 13 and the drain electrode 14. However, under certain conditions, since the cantilever layer 16 is located over the source and drain electrodes 13, 14, the organic semiconductor material may not completely fill the channel region between the source and drain electrodes 13, 14 during the process of forming the organic seminconductor layer 15. In one embodiment, as shown in FIG. 10, at least an opening 16a is formed in a cantilever layer 16, so that the organic semiconductor material can be provided via the opening 16a so as to completely fill the channel region. In this embodiment, a final organic thin film transistor includes at least the opening 16a to expose a part of an organic semiconductor layer 15 disposed under the cantilever layer 16.

When the spin coating method or the dipping method is used to form the organic semiconductor layer 15, the organic semiconductor material 15c may remain on the cantilever layer 16 as illustrated in FIG. 8. In one embodiment, the remaining organic semiconductor material 15c is removed.

During the removal process, the part of the organic semiconductor layer 15 which is exposed through the opening 16a formed in the cantilever layer 16 can be damaged. A channel is formed in the organic semiconductor layer 15 according to a signal applied to the gate electrode 11. A current flows between the source electrode 13 and the drain electrode 14 through the channel. In this embodiment, to prevent the channel region of organic semiconductor layer 15 from being damaged, the opening 16a is not formed directly over the channel region as illustrated in FIG. 10.

Figure 11:
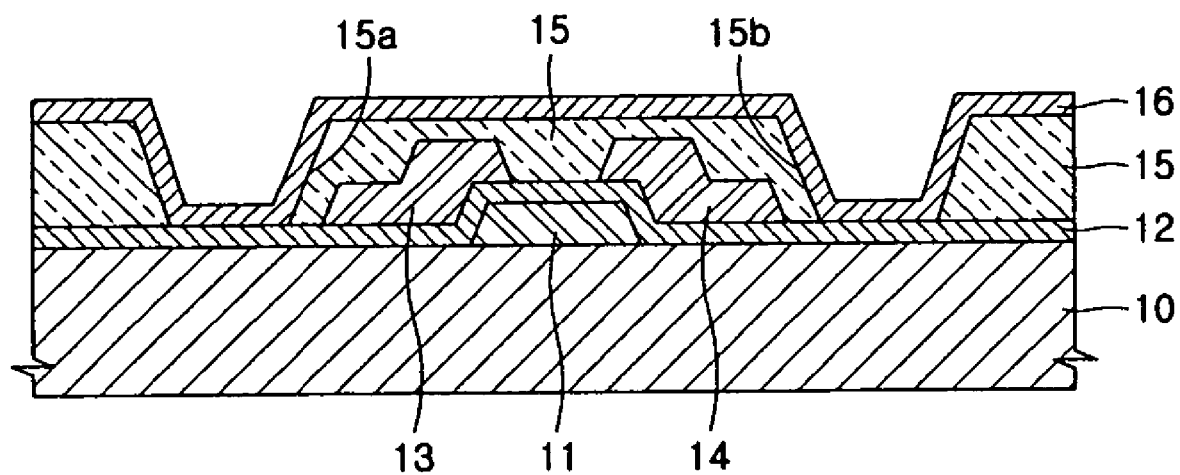
FIG. 11 is a schematic cross-sectional view of an organic thin film transistor according to still another exemplary embodiment of the present invention.

FIG. 11 is a schematic cross-sectional view of an organic thin film transistor according to still another exemplary embodiment of the present invention.

In one embodiment, as shown in FIG. 11, the organic semiconductor layer 15 includes edges 15a and 15b in both side directions. That is, when the organic semiconductor layer 15 is adjacent to a plurality of thin film transistors, the organic semiconductor layer 15 can include the edges 15a and 15b between the adjacent thin film transistors.

Figure 12:
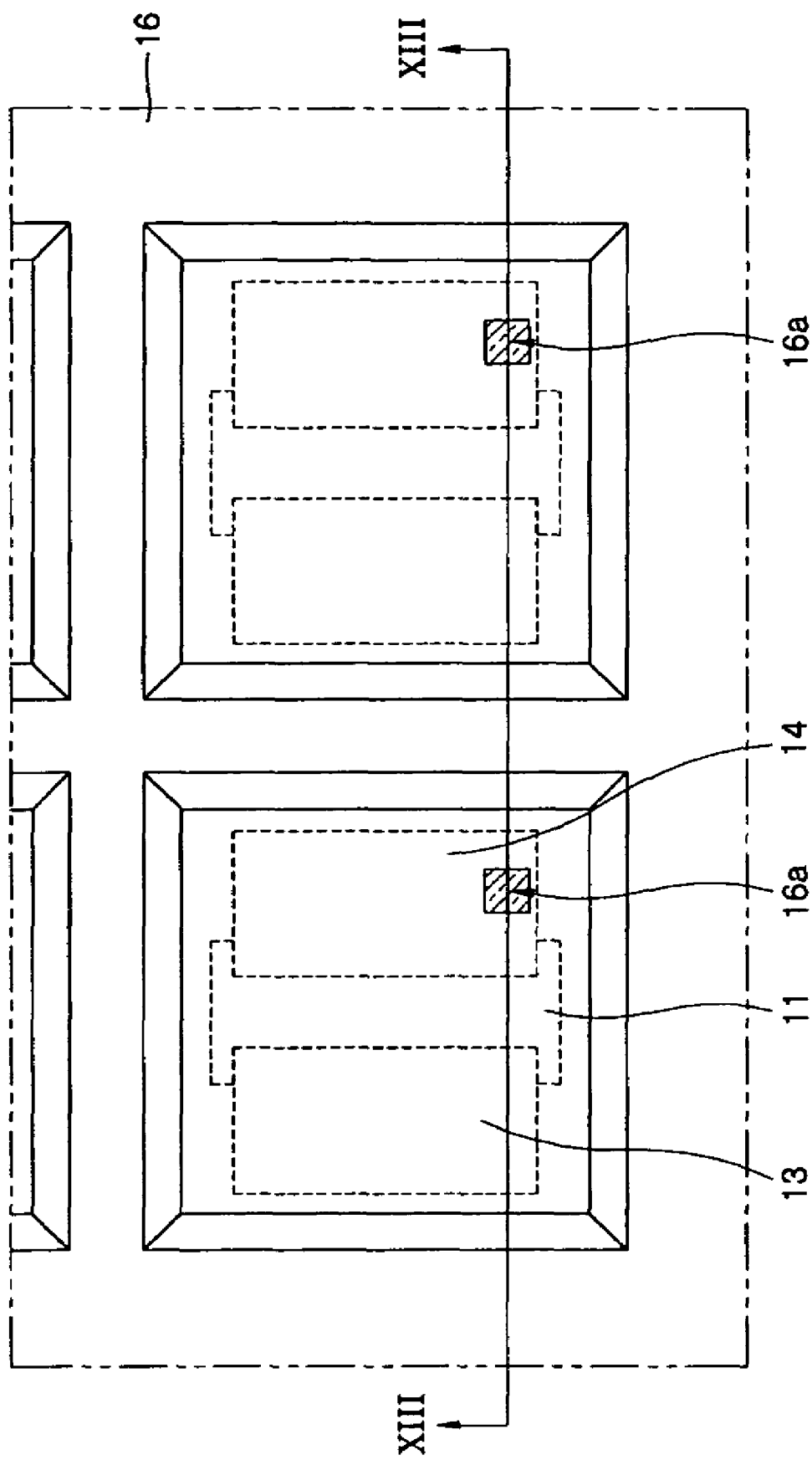
FIG. 12 is a schematic cross-sectional view of an organic thin film transistor according to yet another exemplary embodiment of the present invention.
Figure 13:
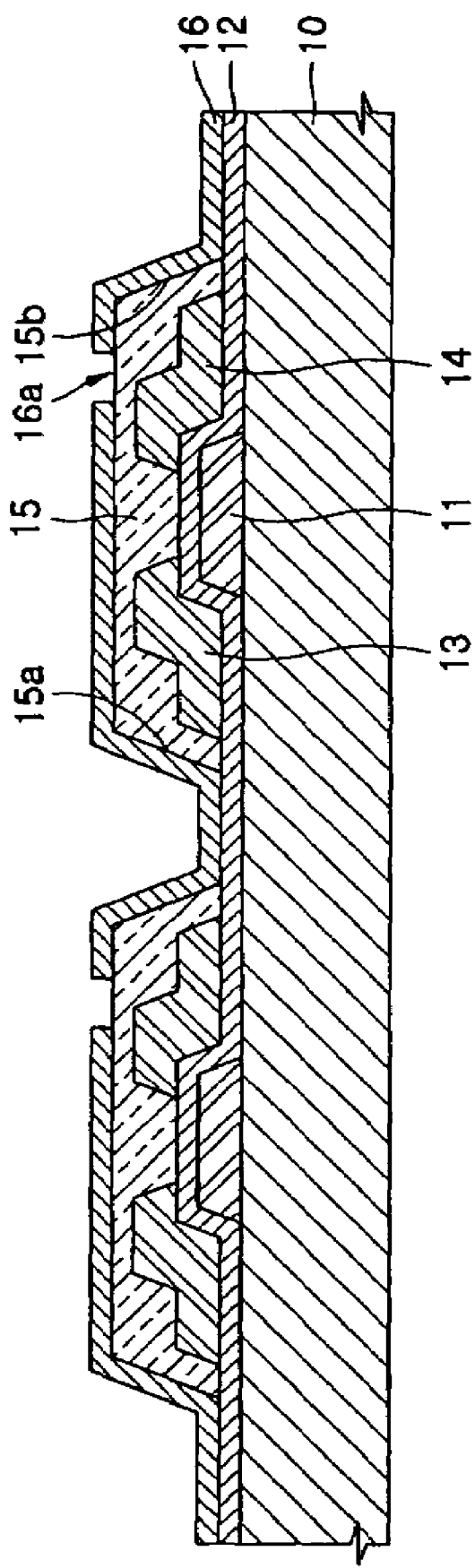
FIG. 13 is a cross-sectional view taken along the lines XIII-XIII of FIG. 12.

FIG. 12 is a schematic cross-sectional view of an organic thin film transistor according to yet another exemplary embodiment of the present invention, and FIG. 13 is a cross-sectional view taken along the lines XIII-XIII of FIG. 12.

Referring to FIGS. 12 and 13, a closed trace (a square surrounding an individual OTFT along the edge portion in FIG. 12) is formed by a part that contacts the cantilever layer 16, is disposed in or under the organic semiconductor layer 15, and is exposed to the outside of the edge of the organic semiconductor layer 15. The gate insulation film 12 disposed under the organic semiconductor layer 15 is exposed to the outside of the edge of the organic semiconductor layer 15 in FIGS. 12 and 15. A part where the exposed part contacts the cantilever layer 16 forms the closed trace. That is, an organic semiconductor layer is separately patterned to correspond to respective organic thin film transistors, thereby preventing cross talk produced by a leakage current between adjacent organic thin film transistors.

In one embodiment, in order to prevent cross talk produced by the leakage current between adjacent organic thin film transistors, a channel region is separated from an adjacent thin film transistor. In one embodiment, the channel region is located in the closed trace formed by the portion that i) contacts the cantilever layer 16, ii) is disposed in or under the organic semiconductor layer 15, and iii) is exposed to the outside of the edge of the organic semiconductor layer 15, thereby preventing cross talk between adjacent organic thin film transistors. In one embodiment, as discussed above at least an opening 16a is formed in the cantilever layer 16 where an organic semiconductor material can be injected to form the organic semiconductor layer 15.

Figure 14:
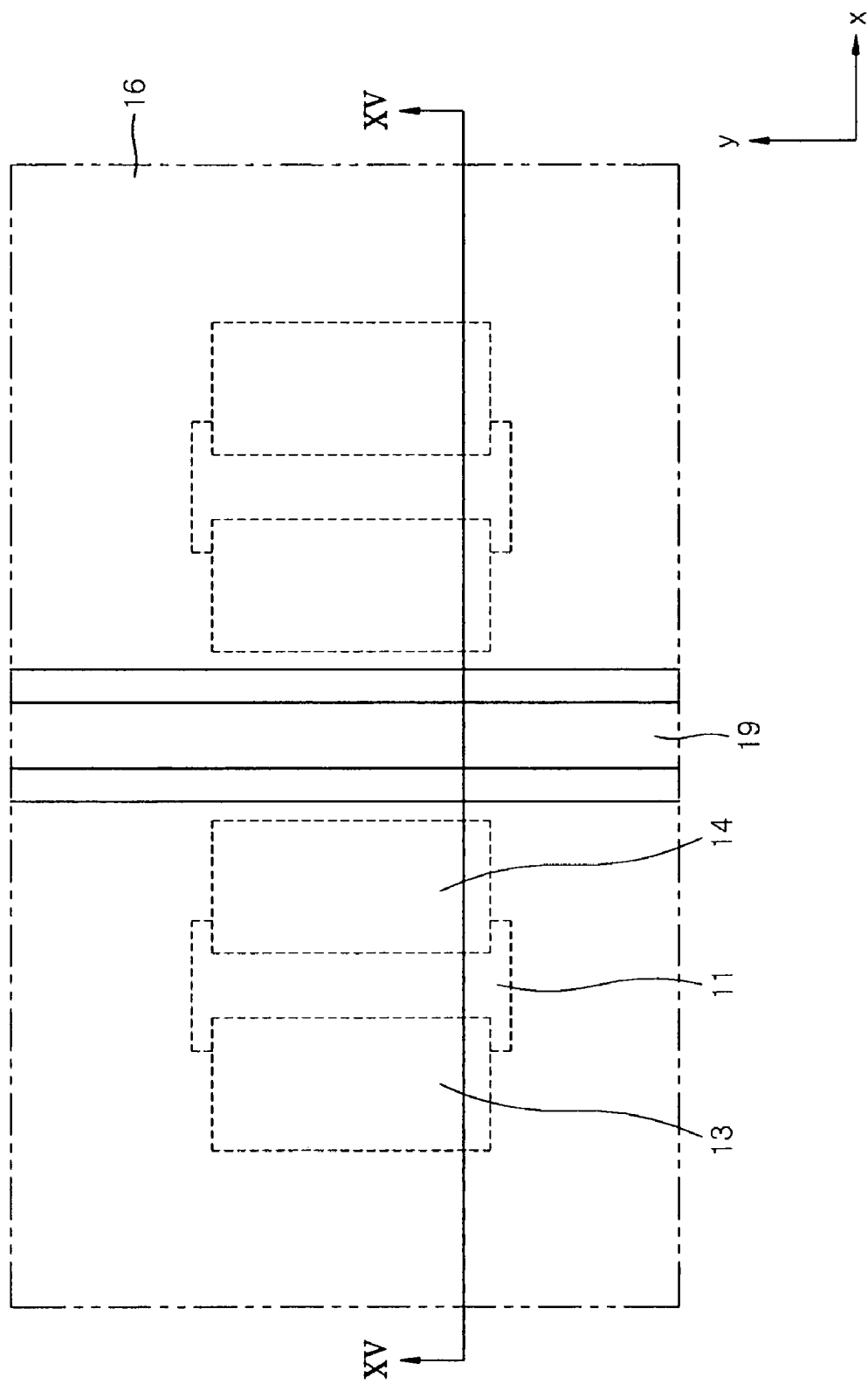
FIG. 14 is a schematic cross-sectional view of an organic thin film transistor according to a further exemplary embodiment of the present invention.
Figure 15:
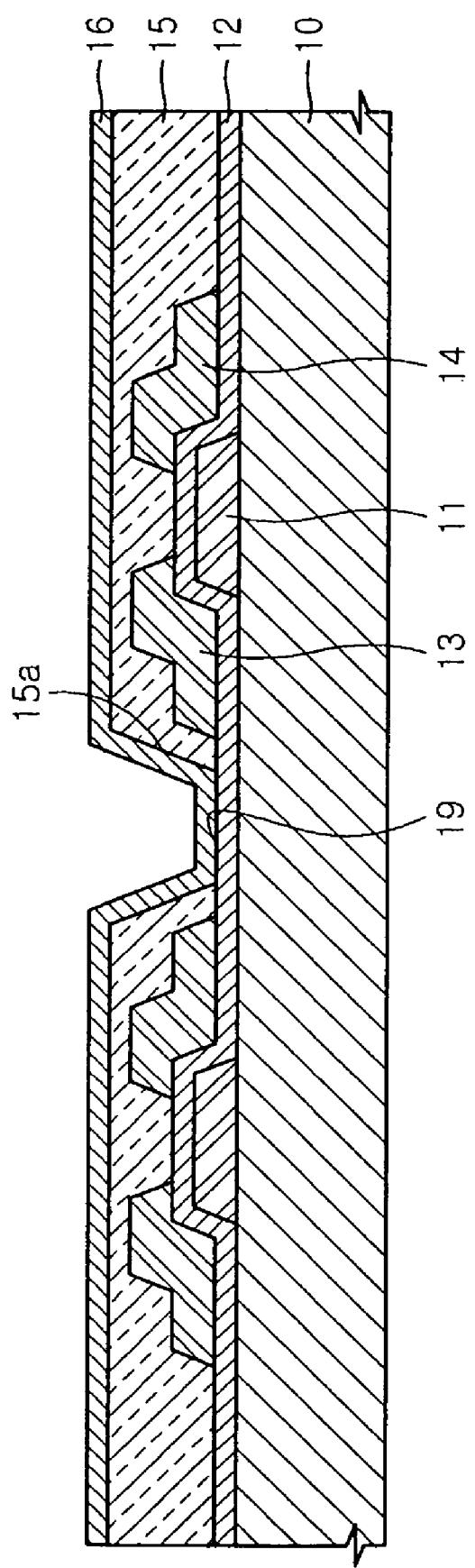
FIG. 15 is a cross-sectional view taken along the lines XV-XV of FIG. 14.

FIG. 14 is a schematic cross-sectional view of an organic thin film transistor according to a further exemplary embodiment of the present invention, and FIG. 15 is a cross-sectional view taken along the lines XV-XV of FIG. 14.

Organic thin film transistors in the form of an array tend to be disposed in a uniform pattern. Referring to FIG. 14, two adjacent thin film transistors in an x direction are sufficiently spaced from two adjacent thin film transistors in a direction perpendicular to the x direction, i.e., in a y direction. It is sufficient that organic semiconductor layers of the two adjacent thin film transistors in the x direction are patterned. Since organic semiconductor layers have a high resistance, thin film transistors which are sufficiently spaced from each other do not produce cross talk.

In one embodiment, a portion that i) contacts a cantilever layer 16, ii) is disposed in or under an organic semiconductor layer 15, and iii) is exposed to the outside of an edge 15a of the organic semiconductor layer 15 can generally form a straight line 19 (in a y direction in FIG. 14) when seen from the top of the transistor as shown in FIG. 14. Referring to FIGS. 14 and 15, the contacting portion between the gate insulation film 12 and the cantilever layer 16 approximately forms the straight line 19.

Figure 16:
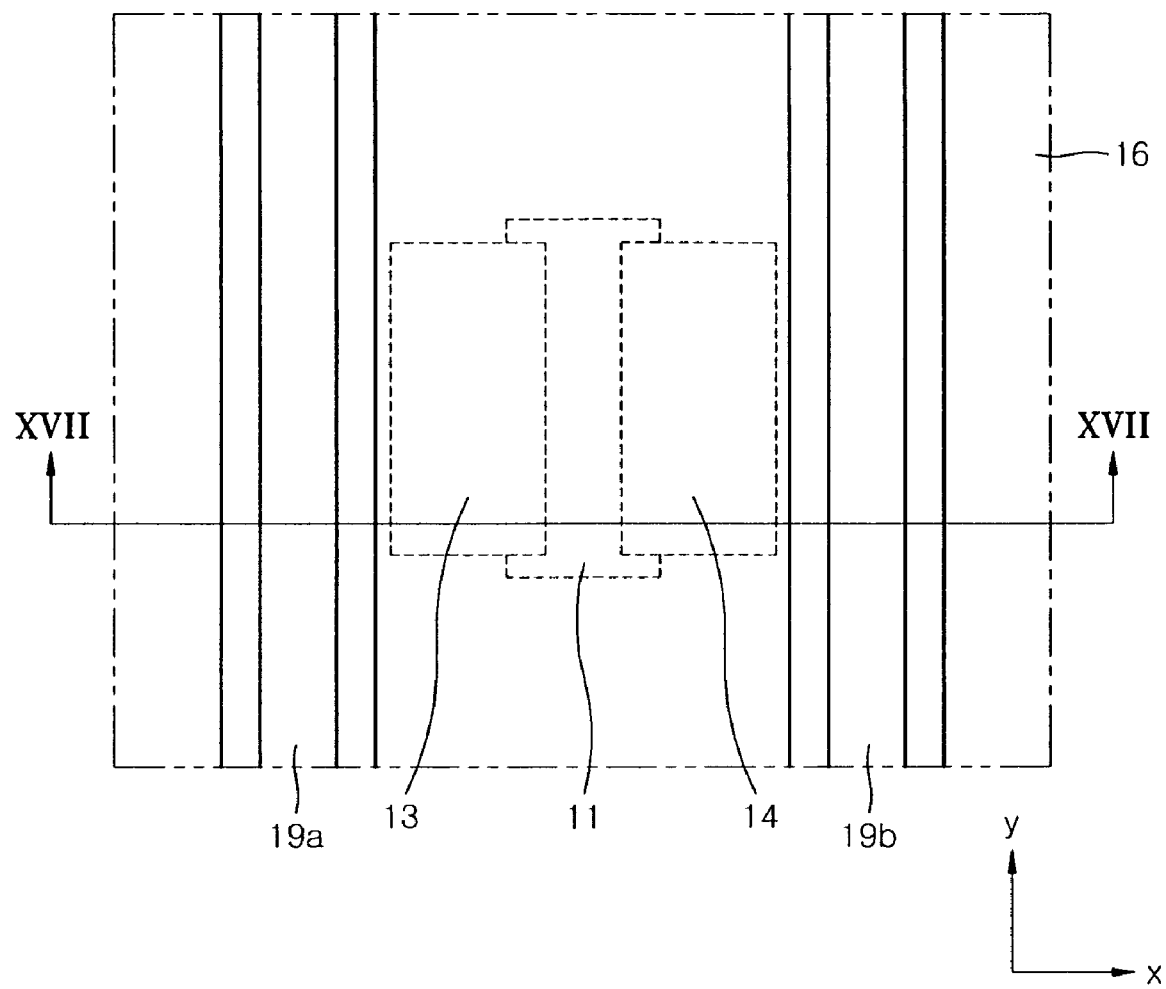
FIG. 16 is a schematic cross-sectional view of an organic thin film transistor according to a further exemplary embodiment of the present invention.
Figure 17:
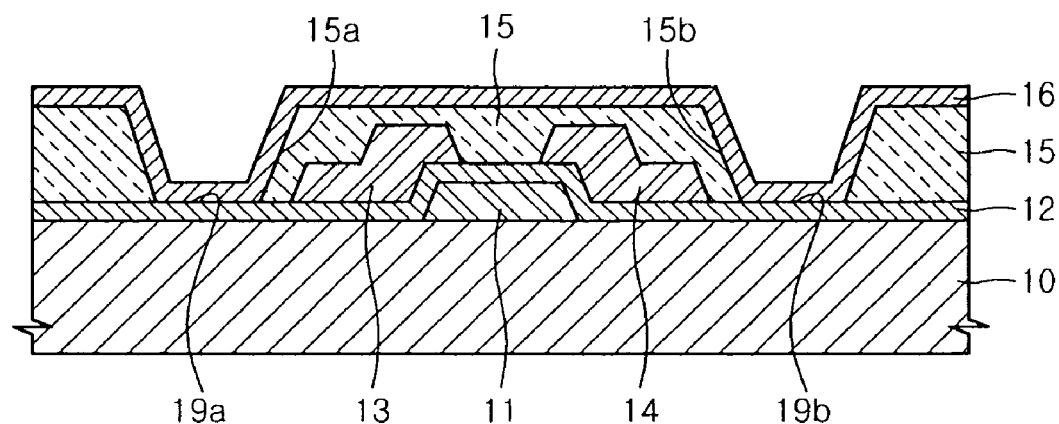
FIG. 17 is a cross-sectional view taken along the lines XVII-XVII of FIG. 16.

It is also possible that more than two organic thin film transistors are adjacent in an x direction in FIG. 14. If so, as depicted in FIGS. 16 and 17, at least one pair of parallel lines 19a and 19b (in a y direction in FIG. 16) are formed by contacting portions. In FIGS. 16 and 17, two parallel lines 19a and 19b (parallel in a y direction in FIG. 16) are formed in each side of the organic semiconductor layer.

Figure 18:
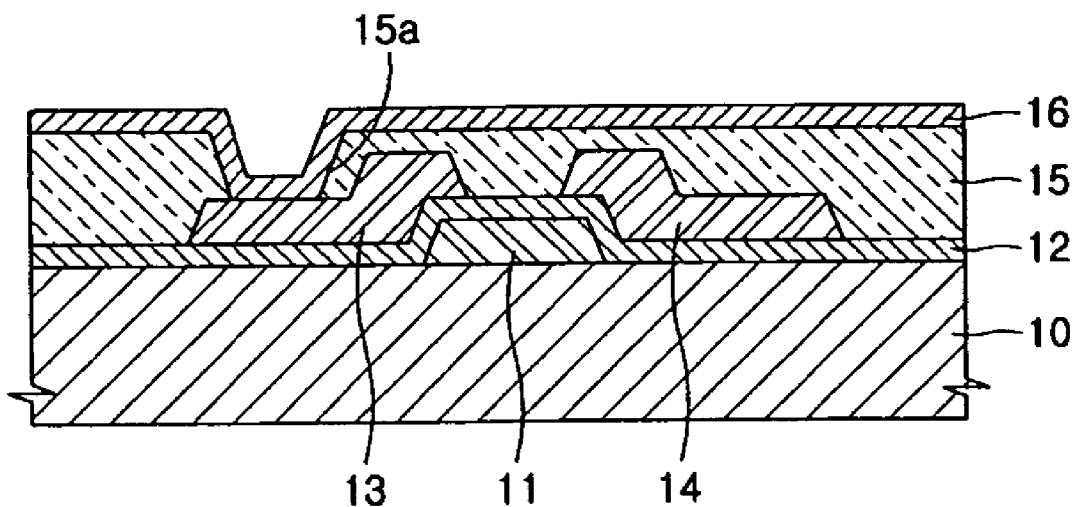
FIG. 18 is a schematic cross-sectional view of an organic thin film transistor according to a further exemplary embodiment of the present invention.
Figure 19:
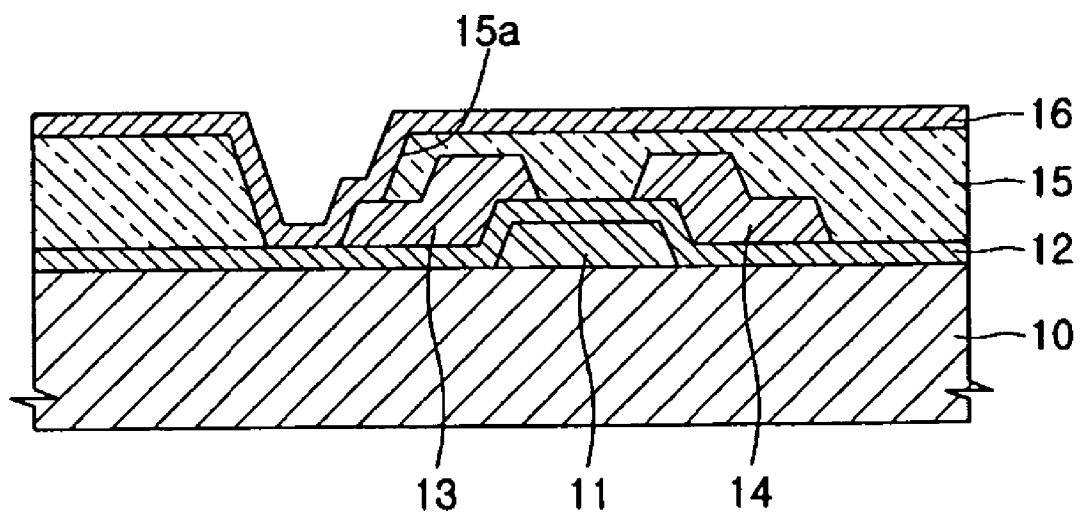
FIG. 19 is a schematic cross-sectional view of an organic thin film transistor according to a further exemplary embodiment of the present invention.

FIGS. 18 and 19 are schematic cross-sectional views of organic thin film transistors according to a further exemplary embodiment of the present invention.

The organic thin film transistors of the previous exemplary embodiments include organic semiconductor layers patterned by exposing a portion of a gate insulation film disposed under an organic semiconductor layer to the outside of an edge of the organic semiconductor layer, and contacting the exposed portion and a cantilever layer.

However, portions other than the gate insulation film may be exposed to the outside of the edge of the organic semiconductor layer. For example, as illustrated in FIG. 18, a source electrode 13 is exposed to the outside of an edge 15a of the organic semiconductor layer 15, and the exposed portion contacts the cantilever layer 16, providing an patterning effect of the organic semiconductor layer 15. As another example, as illustrated in FIG. 19, the source electrode 13 and the gate insulation film 12 are exposed to the outside of the edge 15a of the organic semiconductor layer, and the exposed portion contacts the cantilever layer 16, providing an patterning effect of the organic semiconductor layer. Furthermore, other variations or modifications are also possible.

In one embodiment, in the organic thin film transistors in the above embodiments and modifications, the cantilever layer 16 can be formed of a conductive material to which a bias voltage is applied, thereby improving characteristics of the organic thin film transistors.

In one embodiment, when the organic semiconductor layer 15 is formed of a p-type organic semiconductor material, carriers which form a channel in an organic thin film transistor are holes. In this embodiment, if a negative voltage is applied to a gate electrode 11, holes of the organic semiconductor layer 15 are accumulated on a surface facing the gate insulation film 12 by an electric field produced by the applied negative voltage. As a result, a channel made of holes ("hole channel") is formed around the gate insulation film 12, through which a current flows between the source electrode 13 and the drain electrode 14 according to a potential difference.

In one embodiment, in order to easily form the hole channel around the gate insulation film 12, a negative voltage is applied to the gate electrode 11, and a positive voltage is applied to the cantilever layer 16. The application of the positive voltage to the cantilever layer 16 results in the accumulation of more holes around the gate insulation film 12, thereby easily forming the channel and reducing a threshold voltage Vth of the organic thin film transistors.

When a channel is not formed by not applying the negative voltage to the gate electrode 11 of the p-type organic thin film transistor, the characteristics of the organic thin film transistor can be improved by applying the bias voltage to the cantilever layer 16. In other words, carrier holes are not accumulated around the gate insulation film 12 so that a channel is not formed in the organic semiconductor layer 15. In one embodiment, to this end, a positive voltage is applied to the gate electrode 11, and a negative voltage is applied to the cantilever layer 16. In another embodiment, a voltage is not applied to the gate electrode 11 but the negative voltage is applied to the cantilever layer 16. In this regard, the negative voltage is applied to the cantilever layer 16, which indicates that an electric potential of the cantilever layer 16 is relatively lower than that of the gate electrode 11. Therefore, carrier holes of the organic semiconductor layer 15 are accumulated on a surface opposite to the surface toward the gate insulation film 12 by an electric field produced by the applied negative voltage. Thus, the channel is not formed in the organic semiconductor layer 15, meaning that a current does not flow between the source electrode 13 and the drain electrode 14.

The application of the bias voltage to the cantilever layer 16 reduces the threshold voltage Vth and increases an on/of ratio, thereby greatly improving the characteristics of the organic thin film transistor.

In another embodiment, such operations can also be applied to the organic semiconductor layer 15 if it is formed of an n-type organic semiconductor material. In this case, carriers which form a channel in the organic thin film transistor are electrons. In this embodiment, if a positive voltage is applied to the gate electrode 11, electrons of the organic semiconductor layer 15 are accumulated on a surface toward the gate insulation film 12 of the organic semiconductor layer 15 by an electric field produced by the applied positive voltage. As a result, a channel made of electrons ("electron channel") is formed around the gate insulation film 12 of the organic semiconductor layer 15, through which a current flows between the source electrode 13 and the drain electrode 14 according to a potential difference.

In one embodiment, in order to easily form an electron channel around the gate insulation film 12, a positive voltage is applied to the gate electrode 11, and a negative voltage is applied to the cantilever layer 16. The application of the negative voltage to the cantilever layer 16 results in the accumulation of more electrons around the gate insulation film 12, thereby easily forming the electron channel.

Also, when a channel is not formed by not applying the positive voltage to the gate electrode 11 of the n-type organic thin film transistor, the characteristics of the organic thin film transistor can be improved by applying the bias voltage to the cantilever layer 16. In other words, carrier electrons are not accumulated around the gate insulation film 12 so that a channel is not formed in the organic semiconductor layer 15. In one embodiment, to this end, a negative voltage is applied to the gate electrode 11, and a positive voltage is applied to the cantilever layer 16. In another embodiment, a voltage is not applied to the gate electrode 11 but the positive voltage is applied to the cantilever layer 16. In this regard, the positive voltage is applied to the cantilever layer 16, which indicates that an electric potential of the cantilever layer 16 is relatively higher than that of the gate electrode 11. Therefore, electrons of the organic semiconductor layer 15 are accumulated on a surface opposite to that of the surface facing the gate insulation film 12 of the organic semiconductor layer 15 by an electric field produced by the applied positive voltage. Thus, the channel is not formed in the organic semiconductor layer 15, meaning that a current does not flow between the source electrode 13 and the drain electrode 14.

Figure 20:
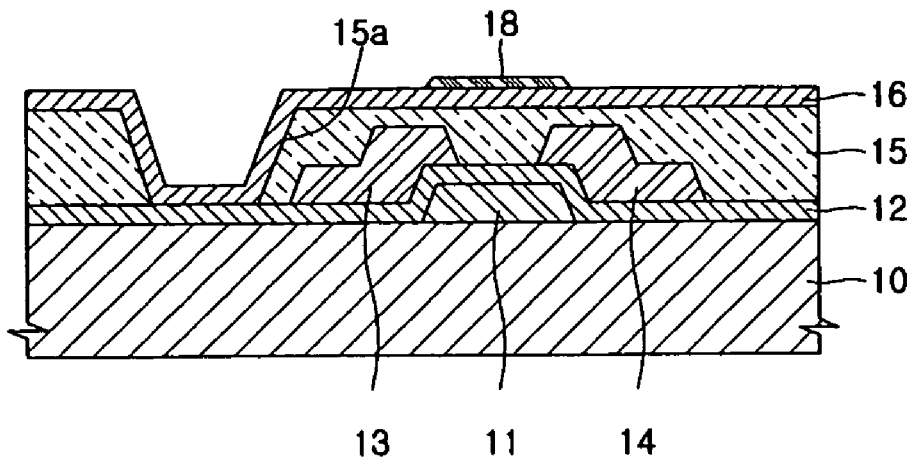
FIG. 20 is a schematic cross-sectional view of an organic thin film transistor according to a further exemplary embodiment of the present invention.

FIG. 20 is a schematic cross-sectional view of an organic thin film transistor according to a further exemplary embodiment of the present invention.

Referring to FIG. 20, in contrast with the above embodiments, the organic thin film transistor includes a cantilever layer 16 formed of an insulating material and an auxiliary electrode 18 formed directly above a gate electrode 11 and on the cantilever layer 16.

In the organic thin film transistors in the previous embodiments, the cantilever layer 16 is formed of a conductive material and a bias voltage is applied to the cantilever layer 16. In this regard, there is no problem in patterning the cantilever layer 16 to correspond to the organic thin film transistors. However, when the cantilever layer 16 is combined with adjacent several organic thin film transistors in a single body, a different bias voltage cannot be applied to each of the organic thin film transistors.

Therefore, the organic thin film transistor of the present embodiment includes the cantilever layer 16 formed of the insulating material and the auxiliary electrode 18 corresponding to the gate electrode 11 to apply the bias voltage to each of the organic thin film transistors. In one embodiment, a voltage applied to the auxiliary electrode 18 is equal to the voltage applied to the cantilever layer 16 of the previous embodiments.

In one embodiment, the auxiliary electrode 18 is formed of a conductive material, e.g., MoW, ITO, etc.

Figure 21:
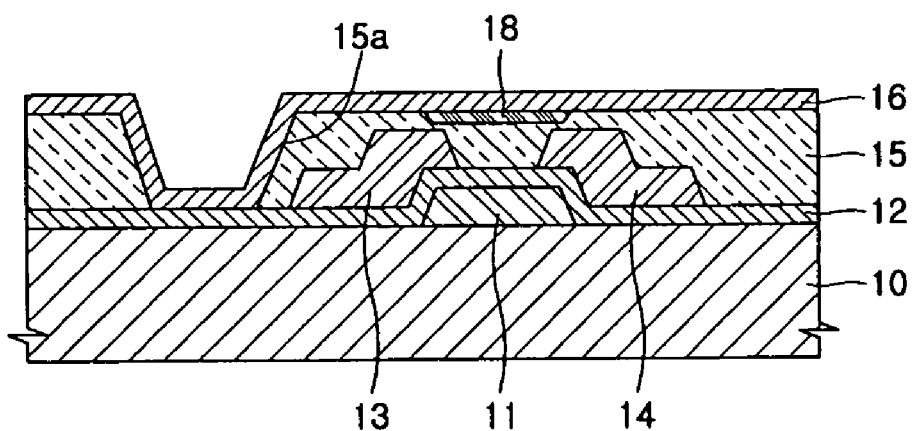
FIG. 21 is a schematic cross-sectional view of an organic thin film transistor according to a further exemplary embodiment of the present invention.
Figure 22:
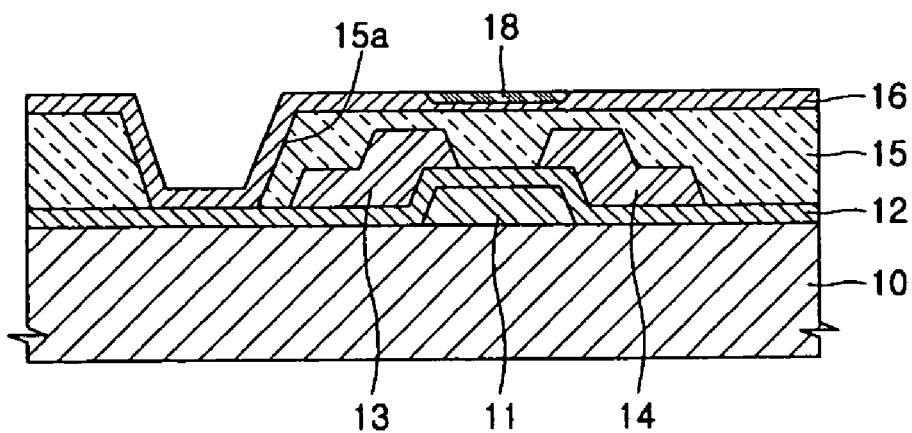
FIG. 22 is a schematic cross-sectional view of an organic thin film transistor according to a further exemplary embodiment of the present invention.
Figure 23:
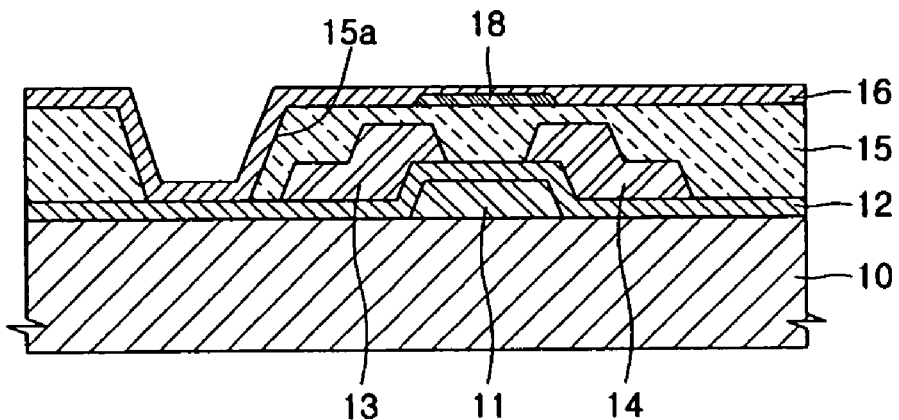
FIG. 23 is a schematic cross-sectional view of an organic thin film transistor according to a further exemplary embodiment of the present invention.
Figure 24:
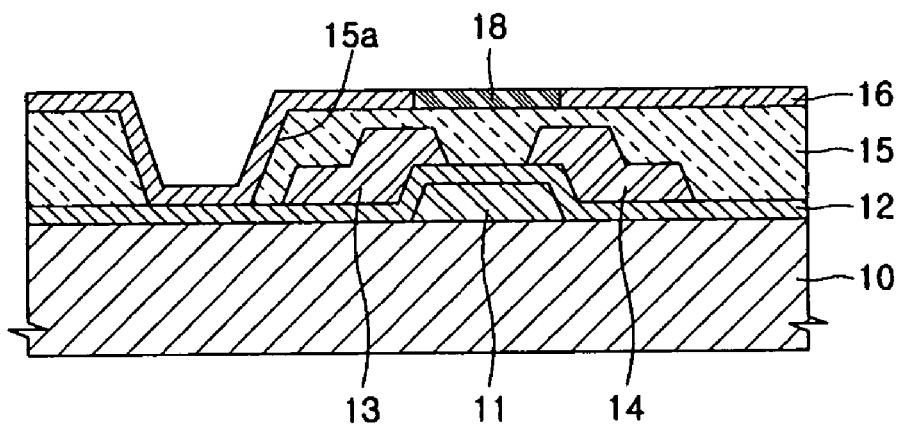
FIG. 24 is a schematic cross-sectional view of an organic thin film transistor according to a further exemplary embodiment of the present invention.

The auxiliary electrode 18 can be disposed in various places. In one embodiment, the auxiliary electrode 18 is disposed on the upper surface of the cantilever layer 16 as illustrated in FIG. 20, and on the bottom surface of the cantilever layer 16, i.e., between the cantilever layer 16 and an organic semiconductor layer 15, as illustrated in FIG. 21. In another embodiment, the auxiliary electrode 18 can be disposed in a groove formed in the cantilever layer 16 as illustrated in FIGS. 22 and 23. In this embodiment, the groove formed in the cantilever layer 16 can be formed in the upper surface of the cantilever layer 16 as illustrated in FIG. 22 and in the bottom surface of the cantilever layer 16 as illustrated in FIG. 23. In another embodiment, the auxiliary-electrode 18 can be disposed in a second opening formed in the cantilever layer 16 as illustrated in FIG. 24. Various forms of the auxiliary electrode 16 can be produced.

Figure 25:
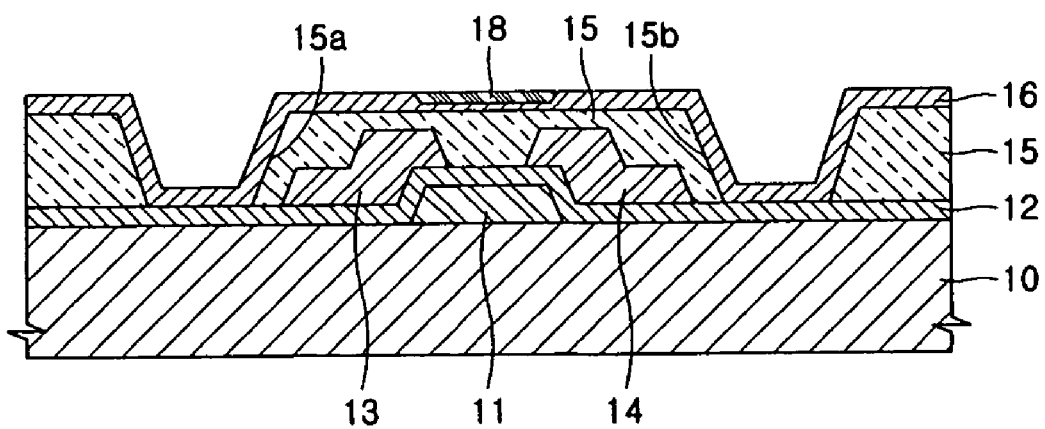
FIG. 25 is a schematic cross-sectional view of an organic thin film transistor according to a further exemplary embodiment of the present invention.

FIG. 25 is a schematic cross-sectional view of an organic thin film transistor according to a further exemplary embodiment of the present invention.

Referring to FIG. 25, the organic semiconductor layer 15 includes edges 15a and 15b in both directions. That is, when the organic semiconductor layer 15 is adjacent to a plurality of thin film transistors, the organic semiconductor layer 15 can include the edges 15a and 15b between the adjacent thin film transistors.

Figure 26:
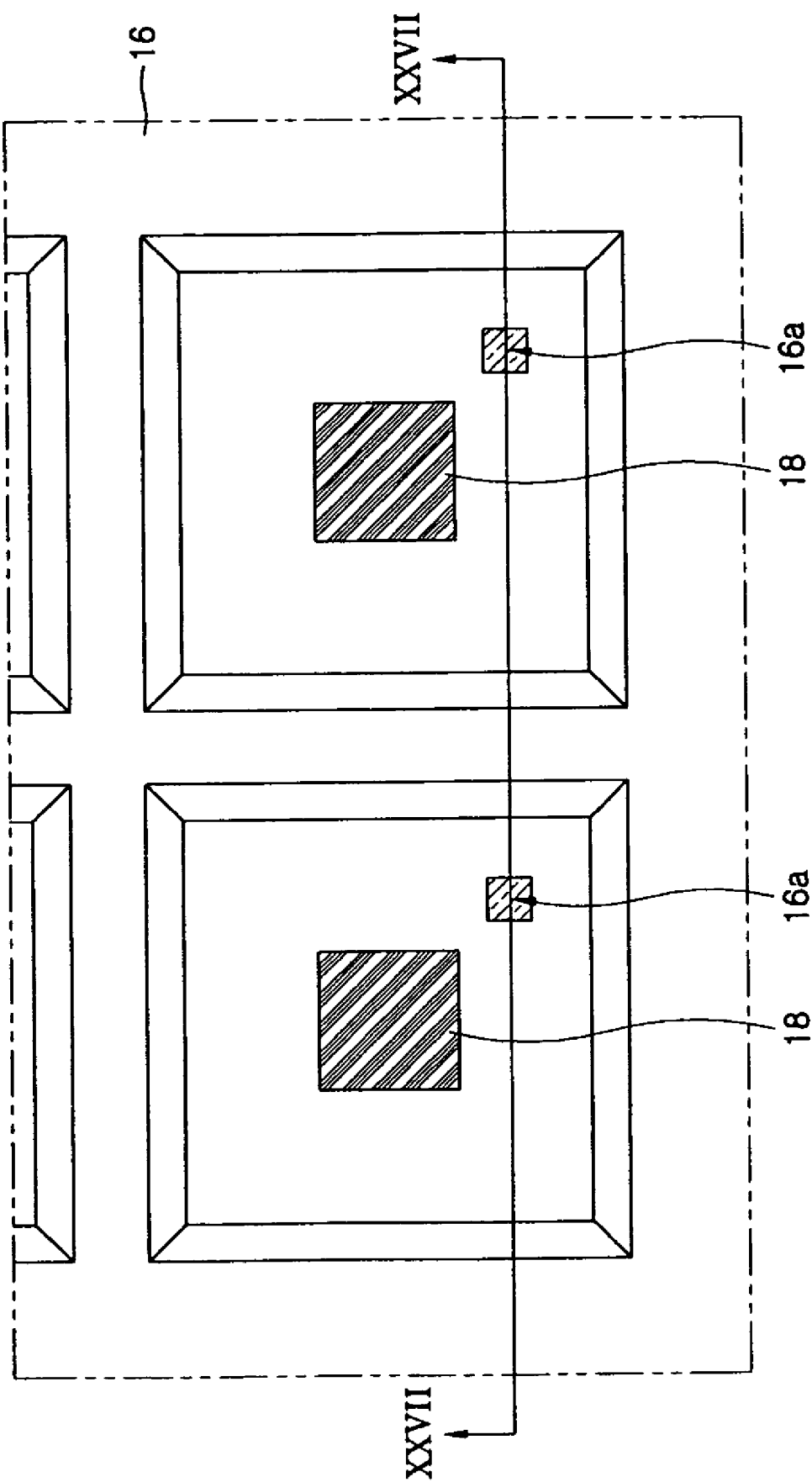
FIG. 26 is a schematic cross-sectional view of an organic thin film transistor according to a further exemplary embodiment of the present invention.
Figure 27:
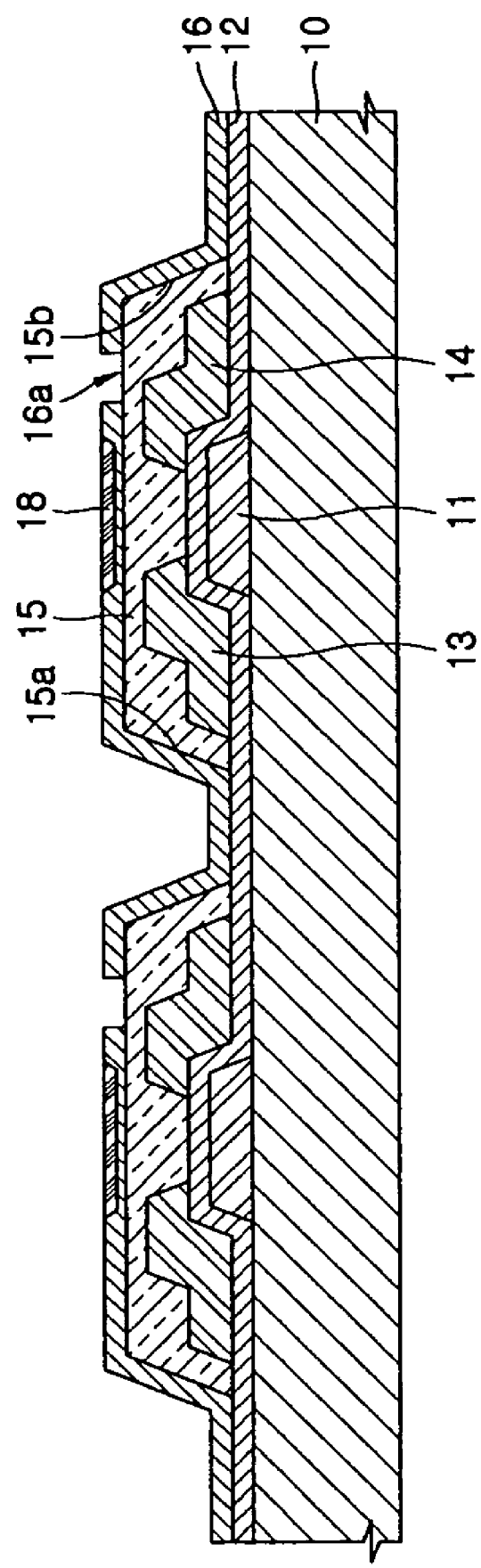
FIG. 27 is a cross-sectional view taken along the lines XXVII-XXVII of FIG. 26.

FIG. 26 is a schematic cross-sectional view of an organic thin film transistor according to a further exemplary embodiment of the present invention, and FIG. 27 is a cross-sectional view taken along the lines XXVII-XXVII of FIG. 26. Since the embodiment shown in FIGS. 26 and 27 are the same as that of FIGS. 12 and 13 except for the auxiliary-electrode 18, the description thereof will be omitted.

As described above, since organic thin film transistors can be flexible, they can be used in a variety of flexible flat display devices including a thin film transistor. In one embodiment, the flexible flat display devices are liquid crystal display device (LCDs) or organic electroluminescence display devices (OELDs).

In one embodiment, the organic thin film transistors can be used as switching thin film transistors or driving thin film transistors in flat display devices, and thin film transistors in a variety of drivers.

When the organic thin film transistors are used as driving thin film transistors, a pixel electrode of a display device can be connected to one of a source electrode and a drain electrode.

In one embodiment, the organic thin film transistor can be utilized in, in particular, electroluminescence display devices (ELDs). ELDs including the organic thin film transistor will now be briefly described.

ELDs include various pixel patterns according to a light-emitting color of an electroluminescence device, and have preferably red, green, and blue sub-pixels. Each of the sub-pixels includes a self-luminescence electroluminescence device.

Although various types of ELDs may be used, the ELD of the present embodiment is an active matrix (AM) type ELD including organic thin film transistors according to the previous embodiments.

ELDs that emit red, green, or blue light according to a current flow and display image information includes a pixel electrode connected to one of a source electrode and a drain electrode of the thin film transistor, a facing electrode for covering the entire pixels, and an intermediate layer including at least a light-emitting layer interposed between the pixel electrode and the facing electrode. The present invention is not restricted to the above structure but may be applied to various structures of ELDs.

The ELD of the present embodiment includes organic thin film transistors according to one of the previously-described embodiments, thereby preventing cross talk and displaying an exact image according to an input image signal.

Embodiments of the present invention may be applied to any display device as long as it includes organic thin film transistors. In one embodiment, the organic thin film transistor can be embedded in each of sub-pixels and in a driver circuit in which an image is not displayed.

An organic thin film transistor according to embodiments of the present invention, a flat display device including the organic thin film transistor, and a method of manufacturing the organic thin film transistor have the following effects:

First, an organic semiconductor layer is automatically patterned using a cantilever layer without physically patterning the organic semiconductor layer.

Second, a dry type or wet type etching process is unnecessary after forming the organic semiconductor layer, thereby improving the characteristics of the organic semiconductor layer.

Third, the cantilever layer serves as a passivation film that protects the organic thin film transistor from exterior moisture or other impurities, so that it is not necessary to form an additional passivation layer later.

Fourth, a bias voltage is applied to the cantilever layer to reduce a threshold voltage and increase an on/off ratio of the organic thin film transistor, thereby greatly improving the characteristics of the organic thin film transistor.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. An organic thin film transistor, comprising:
    a substrate;
    a gate electrode formed on the substrate;
    a gate insulation film formed on the gate electrode;
    a source electrode and a drain electrode spaced from each other and formed on the gate insulation film;
    an organic semiconductor layer formed over the source electrode and the drain electrode; and
    a cantilever layer covering the organic semiconductor layer, wherein at least part of a selected one of i) the gate insulation film, ii) the source electrode and iii) the drain electrode directly contacts the cantilever layer.

2. The organic thin film transistor of claim 1, wherein the selected one is the gate insulation film.

3. The organic thin film transistor of claim 1, wherein the cantilever layer comprises at least one opening to expose a part of the organic semiconductor layer.

4. The organic thin film transistor of claim 3, wherein the at least one opening of the cantilever layer corresponds to a region other than the region between the source electrode and the drain electrode.

5. The organic thin film transistor of claim 1, wherein the gate insulation film covers the gate electrode.

6. The organic thin film transistor of claim 1, wherein the cantilever layer is formed from conductive material.

7. The organic thin film transistor of claim 6, wherein the cantilever layer is configured to receive a bias voltage.

8. The organic thin film transistor of claim 6, wherein the cantilever layer is configured to receive a voltage having a polarity opposite to that of the voltage applied to the gate electrode.

9. The organic thin film transistor of claim 6, wherein the cantilever layer is configured to receive a voltage having a polarity opposite to that of the voltage applied to the gate electrode when a channel is formed in the organic semiconductor layer.

10. The organic thin film transistor of claim 6, wherein the organic semiconductor layer is a p-type organic semiconductor layer, and an electric potential of the cantilever layer is lower than that of the gate electrode when the channel is not formed in the organic semiconductor layer.

11. The organic thin film transistor of claim 6, wherein the organic semiconductor layer is an n-type organic semiconductor layer, and an electric potential of the cantilever layer is higher than that of the gate electrode when the channel is not formed in the organic semiconductor layer.

12. The organic thin film transistor of claim 1, wherein the cantilever layer is formed over the organic semiconductor layer, the source electrode and the drain electrode.

13. An organic thin film transistor, comprising:
    a substrate;
    a gate electrode formed on the substrate;
    a gate insulation film formed on the gate electrode;
    a source electrode and a drain electrode spaced from each other and formed on the gate insulation film;
    an organic semiconductor layer formed over the source electrode and the drain electrode; and
    a cantilever layer covering the organic semiconductor layer, wherein at least part of a selected one of i) the gate insulation film, ii) the source electrode and iii) the drain electrode contacts the cantilever layer, and wherein a closed trace is formed by surrounding the organic thin film transistor along the part so as to prevent cross talk produced by a leakage current between adjacent organic thin film transistors.

14. The organic thin film transistor of claim 13, wherein the region between the source electrode and the drain electrode is located within the closed trace.

15. A flat display device comprising an organic thin film transistor, wherein the organic thin film transistor includes:
    a substrate;
    a gate electrode formed on the substrate;
    a gate insulation film formed on the gate electrode;
    a source electrode and a drain electrode spaced from each other and formed on the gate insulation film;
    an organic semiconductor layer formed over the source electrode and the drain electrode; and
    a cantilever layer covering the organic semiconductor layer, wherein at least part of a selected one of i) the gate insulation film, ii) the source electrode and iii) the drain electrode directly contacts the cantilever layer.

16. The flat display device of claim 15, wherein the cantilever layer is formed over the organic semiconductor layer, the source electrode and the drain electrode.

17. An organic thin film transistor (OTFT), comprising:
    a first organic semiconductor layer formed on a substrate and separated from a second organic semiconductor layer of an adjacent OTFT, wherein each of the first and second organic semiconductor layers includes a side surface, wherein the side surfaces oppose and are discontinuous with respect to each other;
    a gate electrode disposed on the substrate;
    a gate insulation layer disposed on the gate electrode;
    a source electrode and a drain electrode spaced from each other and disposed on the gate insulation layer, wherein the first organic semiconductor layer covers the source and drain electrodes and the gate insulation layer; and
    a cantilever protective layer covering at least the first organic semiconductor layer, wherein at least part of a selected one of i) the gate insulation layer, ii) the source electrode and iii) the drain electrode directly contacts the cantilever layer.

18. The organic thin film transistor of claim 17, wherein the cantilever protective layer is formed of tetra ethyl ortho silicate (TEOS) or silicon nitride.

19. The organic thin film transistor of claim 17, wherein the cantilever protective layer is formed over the organic semiconductor layer, the source electrode and the drain electrode.

20. A flat display device comprising an organic thin film transistor, wherein the organic thin film transistor includes:
    a substrate;
    a gate electrode formed on the substrate;
    a gate insulation film formed on the gate electrode;

a source electrode and a drain electrode spaced from each other and formed on the gate insulation film;

an organic semiconductor layer formed over the source electrode and the drain electrode; and a cantilever layer covering the organic semiconductor layer, wherein at least part of a selected one of i) the gate insulation film, ii) the source electrode and iii) the drain electrode contacts the cantilever layer, and wherein a closed trace is formed by surrounding the organic thin film transistor along the pan so as to prevent cross talk produced by a leakage current between adjacent organic thin film transistors.

21. An organic thin film transistor (OTFT), comprising:

a first organic semiconductor layer formed on a substrate and separated from a second organic semiconductor layer of an adjacent OTFT, wherein each of the first and second organic semiconductor layers includes a side surface, wherein the side surfaces oppose and are discontinuous with respect to each other;

a gate electrode disposed on the substrate;

a gate insulation layer disposed on the gate electrode;

a source electrode and a drain electrode spaced from each other and disposed on the gate insulation layer, wherein the first organic semiconductor layer covers the source and drain electrodes and the gate insulation layer; and a cantilever protective layer covering at least the first organic semiconductor layer, wherein at least part of a selected one of i) the gate insulation layer, ii) the source electrode and iii) the drain electrode contacts the cantilever layer, and wherein a closed trace is formed by surrounding the organic thin film transistor along the part so as to prevent cross talk produced by a leakage current between adjacent organic thin film transistors.

* * * * *

UNITED STATES PATENT AND TRADEMARK OFFICE
CERTIFICATE OF CORRECTION

PATENT NO. : 7,714,321 B2  Page 1 of 1
APPLICATION NO. : 11/378011
DATED : May 11, 2010
INVENTOR(S) : Kim et al.

It is certified that error appears in the above-identified patent and that said Letters Patent is hereby corrected as shown below:

| Column | Line | Description of Error |
|---|---|---|
| 6 | 3 | Change "polythiophene-heteocyclic" to --polythiophene-heterocyclic--. |
| 6 | 10 | Change "pyromelitic dianhydride" to --pyromellitic dianhydride--. |
| 6 | 10 | Change "pyromelitic diimide," to --pyromellitic diimide,--. |
| 6 | 10-11 | Change "perylentetracarbossyl" to --perylenetetracarboxylic--. |
| 6 | 11 | Change "perylentetracarbossyl" to --perylenetetracarboxylic--. |
| 8 | 10 | Change "seminconductor" to --semiconductor--. |
| 10 | 38 | Change "on/of" to --on/off--. |
| 15 | 10 | In Claim 20, change "pan" to --part--. |

Signed and Sealed this

Twenty-first Day of September, 2010

David J. Kappos
*Director of the United States Patent and Trademark Office*